(12) United States Patent
Tang et al.

(10) Patent No.: US 11,156,505 B2
(45) Date of Patent: Oct. 26, 2021

(54) TEMPERATURE SENSOR

(71) Applicant: Semitronix Corporation, Hangzhou (CN)

(72) Inventors: Zhong Tang, Hangzhou (CN); Yun Fang, Hangzhou (CN); Xiaopeng Yu, Hangzhou (CN); Zheng Shi, Hangzhou (CN)

(73) Assignee: Semitronix Corporation, Hangzhou (CN)

( * ) Notice: Subject to any disclaimer, the term of this patent is extended or adjusted under 35 U.S.C. 154(b) by 90 days.

(21) Appl. No.: 16/726,908

(22) Filed: Dec. 25, 2019

(65) Prior Publication Data
US 2020/0209069 A1 Jul. 2, 2020

(30) Foreign Application Priority Data
Dec. 26, 2018 (CN) .......................... 201811601319.4

(51) Int. Cl.
| | |
|---|---|
| *G01K 11/22* | (2006.01) |
| *G01K 7/00* | (2006.01) |
| *H03K 19/20* | (2006.01) |
| *H03K 3/037* | (2006.01) |
| *H03K 3/03* | (2006.01) |
| *H03K 5/133* | (2014.01) |
| *H03K 5/00* | (2006.01) |

(52) U.S. Cl.
CPC ............ *G01K 7/00* (2013.01); *H03K 3/0315* (2013.01); *H03K 3/0377* (2013.01); *H03K 5/133* (2013.01); *H03K 19/20* (2013.01); *H03K 2005/00195* (2013.01)

(58) Field of Classification Search
CPC ............ G01K 7/00; G01K 7/01; H03K 19/20; H03K 3/0377; H03K 3/0315; H03K 5/133; H03K 2005/00195; H03K 3/3565
USPC .......................................................... 374/117
See application file for complete search history.

(56) References Cited

U.S. PATENT DOCUMENTS

| | | | |
|---|---|---|---|
| 6,731,558 B2* | 5/2004 | Yamauchi ................ | G11C 7/04 365/189.09 |
| 8,154,353 B2* | 4/2012 | Yeric ........................ | G01K 7/32 331/57 |
| 10,067,000 B2* | 9/2018 | Huang ...................... | G01K 7/00 |
| 10,594,303 B2* | 3/2020 | Choi ......................... | G01K 7/32 |

(Continued)

*Primary Examiner* — Ryan Jager
(74) *Attorney, Agent, or Firm* — Syncoda LLC; Feng Ma

(57) ABSTRACT

A reconfigurable all-digital temperature sensor includes a NAND gate and several delay units, the NAND gate comprises two input terminals and an output terminal, one input terminal is used for external starting control signal; a plurality delay units are connected in series, the input end of the first delay unit is connected to the output terminal of the NAND gate, and the output end of the last delay unit is connected to another input terminal of the NAND gate, thereby forming a ring oscillator structure; each delay unit includes a leakage-based inverter and a Schmitt trigger, and the output end of the leakage-based inverter is connected to the input end of the Schmitt trigger. The reconfigurable all-digital temperature sensor can realize the conversion of temperature-leakage-frequency based on the ring oscillator structure in the temperature range of −40~125° C., thereby reducing the design complexity and achieving high accuracy.

20 Claims, 5 Drawing Sheets

(56) References Cited

U.S. PATENT DOCUMENTS

| | | | | |
|---|---|---|---|---|
| 2009/0096495 A1* | 4/2009 | Keigo | ............... | G01K 7/01 |
| | | | | 327/142 |
| 2011/0101998 A1* | 5/2011 | Myers | ............... | G01R 31/2621 |
| | | | | 324/678 |
| 2012/0307867 A1* | 12/2012 | Chung | ............... | G01K 7/32 |
| | | | | 374/170 |
| 2017/0187358 A1* | 6/2017 | Takeuchi | ............. | H03K 3/0315 |

* cited by examiner

TEMPERATURE SENSOR

CROSS-REFERENCE TO RELATED APPLICATION

The present application claims priority to Chinese Patent Application No. CN 201811601319.4 filed on Dec. 26, 2018, the disclosure of which is hereby incorporated by reference in its entirety.

BACKGROUND

With the continuously shrinking of CMOS process nodes, integrated circuit chips functions are more and more complex and with ever increasing integration degree, resulting in potential chip heating problems.

Therefore, in advanced technologies, on-chip heat management is important in designing system on chip (SoC), processor and DRAM.

SUMMARY

Various embodiments of the present disclosure provide a temperature sensor, which can work normally under digital power supply, and can have advantages of small occupation area and strong anti-interference ability.

A temperature sensor according to some embodiments of the present disclosure can include a NAND gate and K delay units. The NAND gate includes two input terminals and an output terminal, one input terminal inputs starting control signal; K delay units are connected in series, the input end of the first delay unit is connected to the output terminal of the NAND gate, and the output end of the last delay unit is connected to another input terminal of the NAND gate; wherein K is even. The temperature sensor circuit according to some embodiments of the present disclosure can have a type of ring oscillator structure.

Each delay unit includes a leakage-based inverter and a Schmitt trigger, and the output end of the leakage-based inverter is connected to the input end of the Schmitt trigger.

The leakage-based inverter includes N-stage PMOS and N-stage NMOS, N is an integer greater than 1: the drain end of the former stage PMOS transistor is connected to the source end of the latter stage PMOS transistor, the source end of the first stage PMOS transistor is connected to VDD, the gate end of the first stage PMOS transistor is connected to $V_P$ signal end, and the gate ends of the second stage to the N-th stage PMOS transistors are connected to $V_{IN1}$ signal end; the drain end of the former stage NMOS transistor is connected to the source end of the latter stage NMOS transistor, the source end of the first stage NMOS transistor is connected to GND, the gate end of the first stage NMOS transistor is connected to the $V_N$ signal end, and the gate ends of the second stage to the N-th stage NMOS transistors are connected to the $V_{IN1}$ signal end; the drain end of the N-th PMOS transistor and the drain end of the N-th NMOS transistor are connected and as the leakage-based inverter's output; the $V_P$ signal end, the $V_{IN1}$ signal end and the $V_N$ signal end are inputted high or low level signals respectively to control the on and off of PMOS and NMOS transistors.

The temperature sensor circuit includes a NAND gate and k delay units, which formed a type of ring oscillator. It is known that, the leakage current of MOS transistor is exponential relationship to temperature, and the leakage current is exponential relationship to output frequency in ring oscillator; the implication is that the output frequency is expo-nential relationship to temperature, therefore, the temperature can be obtained by the output frequency of the ring oscillator.

The temperature sensor circuit can function in the PMOS leakage mode and the NMOS leakage mode by controlling the input level $V_P$ and $V_N$ respectively: when $V_P$ and $V_N$ are high level, the temperature sensor works in the PMOS leakage mode; when $V_P$ and $V_N$ are low level, the temperature sensor circuit works in the NMOS leakage mode.

The PMOS leakage mode is the first stage PMOS of the leakage-based inverter in temperature sensor circuit works in the state of leakage; the NMOS leakage mode is the first stage NMOS of the leakage-based inverter in temperature sensor circuit works in the state of leakage.

In the leakage-based inverter, the second stage to the N-th stage PMOS and NMOS are composed of an equivalent inverter, the first stage PMOS' leakage in the PMOS leakage mode is the main leakage in the temperature sensor circuit, the first stage NMOS' leakage in the NMOS leakage mode is the main leakage in the temperature sensor circuit, therefore, the temperature can be obtain accurately in the two modes.

There are two threshold voltages in the Schmitt trigger: high level and low level, therefore, in some embodiments, the values of the two threshold voltages can be designed for PMOS leakage mode and NMOS leakage mode respectively to optimize the sensitivity of power supply in the two modes.

In some embodiments, the values of threshold voltages of PMOS transistors and NMOS transistors in the Schmitt trigger can be adjusted for the two modes respectively to optimize the sensitivity of power supply.

In some embodiments, the threshold voltage of PMOS transistors and NMOS transistors in the leakage-based inverter are adjusted for the two modes to optimize the sensitivity of power supply.

In some embodiments, the threshold voltage of PMOS transistors and NMOS transistors of in the leakage-based inverter and the Schmitt trigger are adjusted by adjusting gate size and/or manufacturing process.

In some embodiments, the $V_P$ signal end is connected to the $V_N$ signal end in each delay unit, and all the $V_P$ and $V_N$ signal ends are connected to the same signal line.

The Schmitt trigger has a high level and a low-level threshold voltages. It includes four PMOS transistors and four NMOS transistors: the first PMOS, the second PMOS, the third PMOS, the fourth PMOS and the first NMOS, the second NMOS, the third NMOS, the fourth NMOS. The gate ends of the first PMOS, the second PMOS, the first NMOS and the second NMOS are connected to the output end of the leakage-based inverter as the Schmitt trigger's input, the source end of the first PMOS is connected to VDD, the source end of the first NMOS is connected to GND, the drain end of the first PMOS is connected to the source end of the second PMOS, the drain end of the first NMOS is connected to the source end of the second NMOS, the drain end of the second NMOS is connected to the drain end of the second PMOS; the drain ends of the fourth PMOS and the fourth NMOS are connected as the Schmitt trigger's output, the source end of the fourth PMOS is connected to the VDD, the source end of the fourth NMOS is connected to GND; the drain end of the third PMOS is connected to GND, the source end of the third PMOS is connected to the first PMOS' drain end and the second PMOS' source end, the drain end of the third NMOS is connected to the VDD, the source end of the third NMOS is connected to the first NMOS' drain end and the second NMOS' source end; the drain ends of the second PMOS and the second NMOS, the gate ends of the third PMOS and the third NMOS, the gate ends of the fourth PMOS and the fourth NMOS are connected.

Various embodiments of the present disclosure can also provide a method for temperature measurement by applying the temperature sensor. The output frequency of the temperature sensor in the PMOS and NMOS leakage mode are used to calculate the temperature value respectively.

In the PMOS leakage mode, the $V_P$ and the $V_N$ are controlled at high level of the temperature sensor circuit, the first stage NMOS transistor is in on-state, the first stage PMOS transistor is in off-state and works in the state of leakage; if the $V_{IN1}$ is high level VDD, the low level GND is outputted through the equivalent inverter, and low level GND is outputted through the Schmitt trigger; if the $V_{IN1}$ is low level GND, the $V_{IN2}$ is gradually charged through the equivalent inverter due to the leakage effect of the first stage PMOS, and when the $V_{IN2}$ reaches the high level threshold TH of the Schmitt trigger, the Schmitt trigger's $V_{OUT}$ outputs high level VDD.

In the NMOS leakage mode, the $V_P$ and the $V_N$ are controlled at low level of the temperature sensor circuit, the first stage PMOS transistor is in on-state, the first stage NMOS transistor is in off-state and works in the state of leakage; if the $V_{IN1}$ is high level VDD, the $V_{IN2}$ is gradually discharged through the equivalent inverter due to the leakage effect of the first stage NMOS, and when the $V_{IN2}$ reaches the low level threshold VTL of the Schmitt trigger, the Schmitt trigger's $V_{OUT}$ outputs low level GND; if the $V_{IN1}$ is low level GND, the high level VDD is outputted through the equivalent inverter, and high level VDD is outputted through the Schmitt trigger.

The delay of the delay unit is mainly determined by leakage of the MOS transistors. There is strong correlation between leakage of the MOS transistors and temperature, the output frequency of the ring oscillator structure is also strongly correlated with temperature. Therefore, the output frequency of the ring oscillator structure can be measured and used to characterize temperature changes.

A test system with the temperature sensor can also be provided. The test system includes at least one temperature sensor described above, and the temperature sensor can measure the temperature of the test system.

In some embodiments, in addition to the temperature sensor, the test system includes at least one device or chip which need to do heat management.

Compared with conventional temperature sensors, the temperature sensor according to various embodiments of the present disclosure can have one or more of the following advantages: (1) the temperature sensor circuit simplifies the design complexity, the number of control signal lines is reduced, only a few signal lines are needed to control the circuit, thus reducing the occupied area of the chip and the complexity of the circuit further; (2) the temperature sensor can work normally under digital power supply less than 1V, and can realize the conversion of temperature-leakage-frequency based on the ring oscillator structure in the temperature range of −40~125° C., moreover, the temperature sensor with high accuracy (error less than 2° C.); (3) the temperature sensor has strong practicability, it is reconfigurable according different requirements which can realize controllable circuit area; (4) compared with existing temperature sensors, the temperature sensor has according to some embodiments of the present disclosure can have the feature of low power consumption, which can meet the low power consumption requirement of level μW, so that to solve the problem of self-heating and aging; (5) the temperature sensor can be worked in different patterns of work by simple digital control, thus to solve the problem of voltage sensitivity, reduces process deviation and voltage influence, improves circuit robustness, temperature measurement accuracy, and design reliability; (6) the temperature sensor overcomes some shortcomings of traditional inverters, these shortcomings including single threshold, no hysteresis control and susceptibility to external interference; and the anti-interference ability of the sensor is greatly enhanced by the delay unit consisted of Schmitt triggers, the misjudgment may occur only when the external interference voltage exceeds the range of high-level threshold and low-level threshold; (7) the temperature sensor can work in NMOS leakage mode and PMOS leakage mode, the leakage change and threshold change caused by VDD change can be offset in the maximum extent by setting different high-level threshold and low-level threshold, and the sensitivity of temperature measurement is improved.

DETAILED DESCRIPTION

Figure 1:
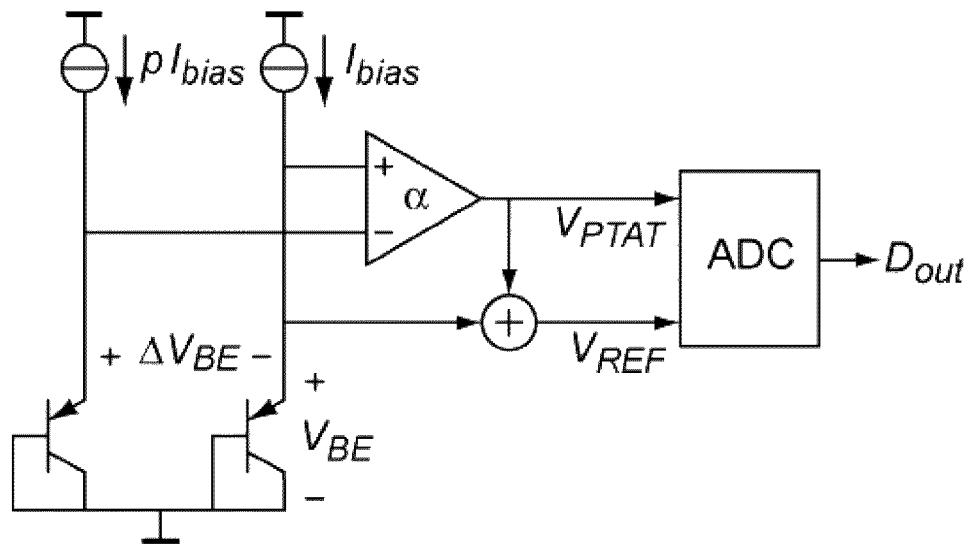
FIG. 1 illustrates a schematic diagram of a temperature sensor composed of parasitic triodes.
Figure 2:
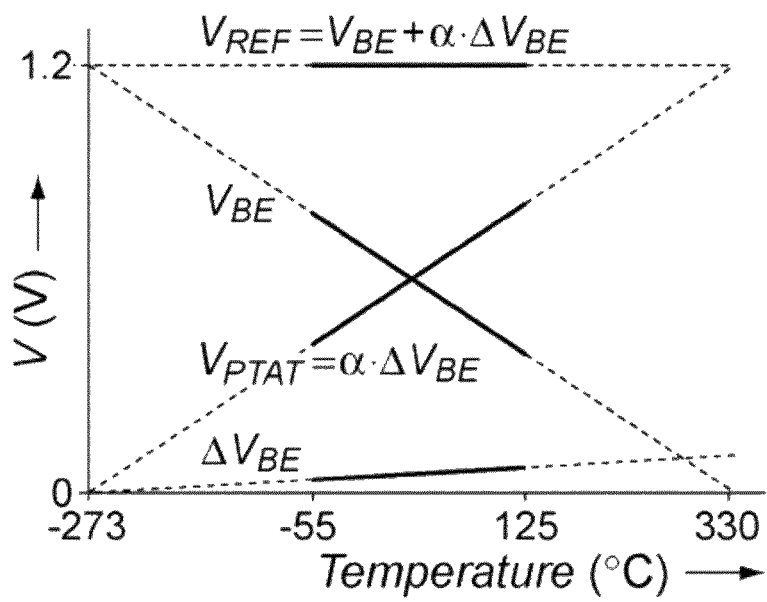
FIG. 2 illustrates a temperature dependency of the key voltages in a sensor.

In the applications of on-chip heat management, multiple locations around complex digital modules may need to be measured frequently. As such, the temperature sensor should have characteristics of small area, strong anti-interference ability, and low cost. Most of the traditional CMOS temperature sensors use parasitic triode as temperature-sensitive device, which can achieve high precision and high linearity. As shown in FIG. 1, the emitter reference voltage $V_{BE}$ of BJT (bipolar junction transistor) has negative linear relationship with temperature, the reference voltage difference between two emitters of BJT $\Delta V_{BE}$ has positive linear relationship with temperature. $V_{REF}=V_{BE}+\alpha \times \Delta V_{BE}$, the reference voltage $V_{REF}$ is independent of temperature. Through amplifying the $\Delta V_{BE}$ and D/A conversion, a ratio of $V_{PTAT}$ to $V_{REF}$ is outputted, as shown in FIG. 2, the higher the ratio corresponding to the higher the temperature (PTAT: proportional to absolute temperature). This kind of traditional CMOS temperature sensor usually needs an operating voltage greater than 1V, large area and complex design, which is not suitable for multi-locations digital integration in on-chip heat management. Therefore, it becomes a hot and difficult subject in the industry to research on a kind of temperature sensor with high precision, small area, low voltage and low cost.

Figure 3:
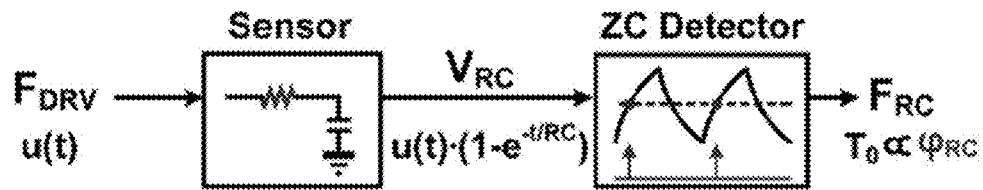
FIG. 3 illustrates a schematic diagram of a temperature sensor composed of resistance.

As shown in FIG. 3, this type temperature sensor can work under low voltage by using resistance as the temperature-sensitive device, but the relationship between resistance and temperature is nonlinear, therefore, additional circuits are needed for digital fitting, which leads to increase design complexity and the area occupied on the chip.

Figure 4:
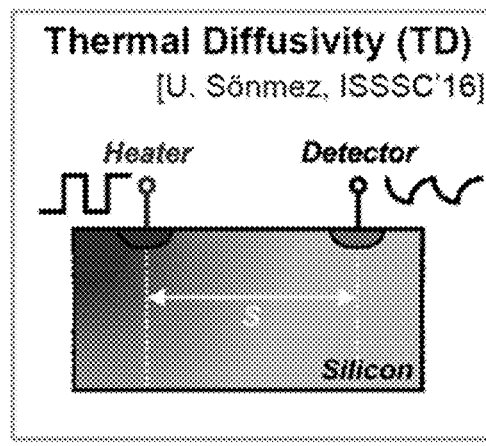
FIG. 4 illustrates thermal diffusivity of an on-chip temperature sensor based on thermoelectric effect.

The on-chip temperature sensor based on thermoelectric effect measures temperature by using the relationship between thermoelectric power and temperature, as shown in FIG. 4. Although this type temperature sensor can work under a voltage less than 1V and occupies a small area on the chip, it needs a large working current, which leads to high power consumption and heating.

Figure 5:
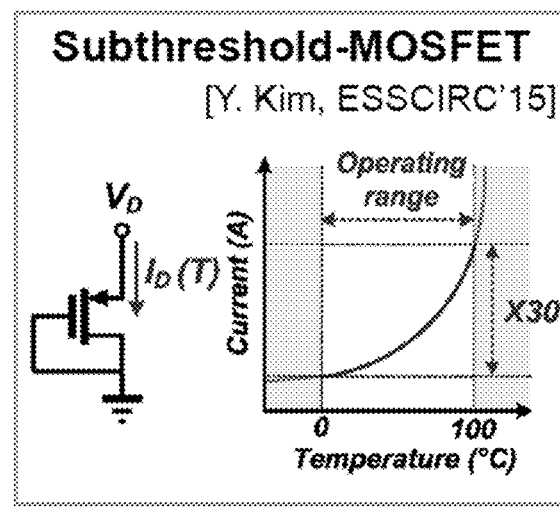
FIG. 5 illustrates a schematic diagram of an all-MOS temperature sensor.

The existing full-MOS temperature sensor converts temperature into delay by using the temperature characteristics of MOS transistors, as shown in FIG. 5. Although this type sensor can meet the requirements of small area and low voltage, its accuracy is insufficient because of the non-linearity of MOS process parameters and the interference of supply voltage to circuit delay. In addition, almost existing technologies are unfavorable to migration process due to use simulation designing method.

Various embodiments of the present disclosure will be further described in conjunction with the drawings and specific embodiments, but the scope of protection of the present disclosure is not limited thereto.

Figure 6:
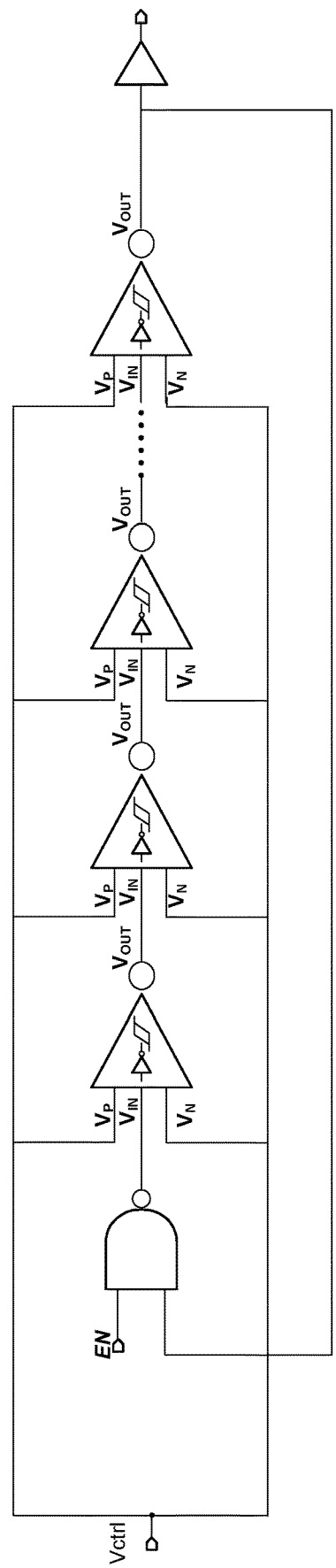
FIG. 6 illustrates the schematic circuit diagram of the temperature sensor according to some embodiments of the present disclosure.

A temperature sensor includes a NAND gate and several delay units, as shown in FIG. 6. The NAND gate comprises two input terminals and an output terminal, one input terminal inputs starting control signal; several delay units and the NAND gate are connected in series, the input end of the first delay unit is connected to the output terminal of the NAND gate, and the output end of the last delay unit is connected to another input terminal of the NAND gate; the number of the delay unit is even. As such, the temperature sensor circuit can have a type of ring oscillator structure.

Figure 7:
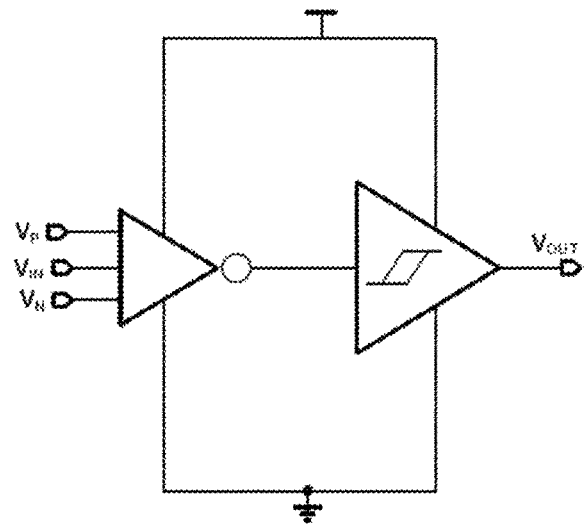
FIG. 7 illustrates the circuit diagram of a delay unit in the FIG. 6.

In some embodiments, as shown in FIG. 7, each delay unit includes a leakage-based inverter and a Schmitt trigger, and the output end of the leakage-based inverter is connected to the input end of the Schmitt trigger. The leakage-based inverter comprises three signal input ports: $V_P$, $V_N$ and $V_{IN}$. In some embodiments, the $V_P$ and $V_N$ can be controlled by one signal line, therefore the signal input ports of the leakage-based inverter only need two control lines: $V_{IN}$ and $V_{N/P}$.

Figure 8:
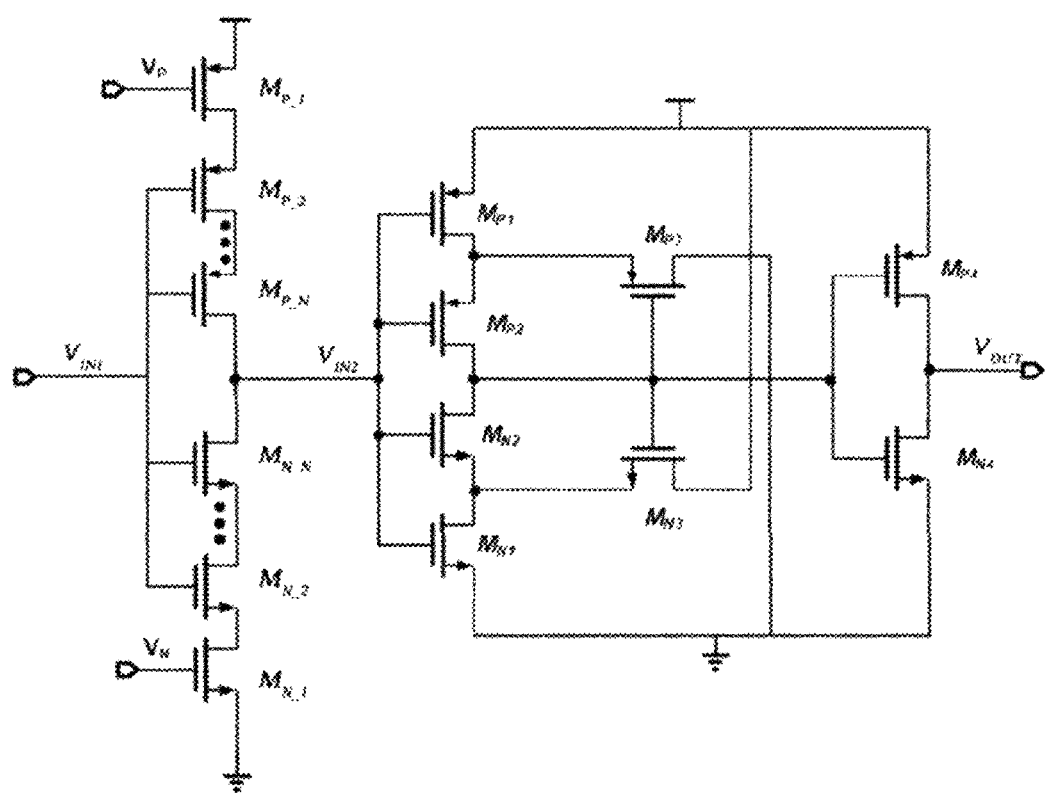
FIG. 8 illustrates the circuit diagram of a delay unit in the FIG. 6 and FIG. 7.

In some embodiments, the detailed circuit of the delay unit can be as that illustrated in FIG. 8. Moreover, the leakage-based inverter and the Schmitt trigger are shown in FIG. 9 and FIG. 10 respectively.

Figure 9:
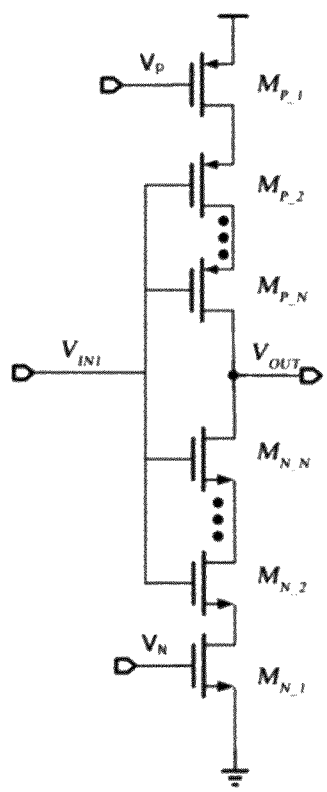
FIG. 9 illustrates the circuit diagram of the leakage-based inverter.

In some embodiments, the leakage-based inverter includes N-stage PMOS and N-stage NMOS, N is an integer greater than 1, as shown in FIG. 9. The connection relationship of the N-stage PMOS and N-stage NMOS in leakage-based inverter as follows: the drain end of the former stage PMOS transistor is connected to the source end of the latter stage PMOS transistor, the source end of the first stage PMOS transistor ($M_{P\_1}$) is connected to VDD, the gate end of the first stage PMOS transistor ($M_{P\_1}$) is connected to $V_P$ signal end, and the gate ends of the second stage to the N-th stage PMOS transistors ($M_{P\_2}$ ... $M_{P\_N}$) are connected to $V_{IN1}$ signal end; the drain end of the former stage transistor is connected to the source end of the latter stage NMOS transistor, the source end of the first stage NMOS transistor ($M_{N\_1}$) is connected to GND, the gate end of the first stage NMOS transistor ($M_{N\_1}$) is connected to the $V_N$ signal end, and the gate ends of the second stage to the N-th stage NMOS transistors($M_{N\_2}$ ... $M_{N\_N}$) are connected to the $V_{IN1}$ signal end; the drain end of the N-th PMOS transistor($M_{P\_N}$) and the drain end of the N-th NMOS transistor($M_{N\_N}$) are connected and as output end of the leakage-based inverter, the output end of the leakage-based inverter is the input end ($V_{IN2}$) of the Schmitt trigger.

Figure 10:
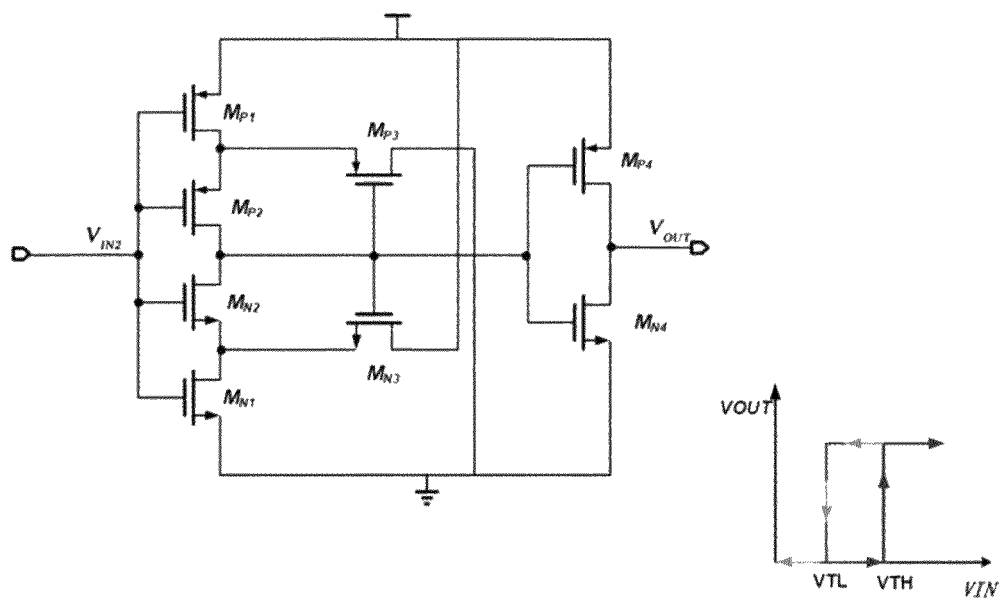
FIG. 10 illustrates the schematic diagram of the Schmitt trigger.

In some embodiments, the Schmitt trigger includes four PMOS transistors and four NMOS transistors, as shown in FIG. 10. The four PMOS transistors are the first PMOS $M_{P1}$, the second PMOS $M_{P2}$, the third PMOS $M_{P3}$, the fourth PMOS $M_{P4}$, the four NMOS transistors are the first NMOS $M_{N1}$, the second NMOS $M_{N2}$, the third NMOS $M_{N3}$, the fourth NMOS $M_{N4}$. The gate ends of $M_{P1}$, $M_{P2}$, $M_{N1}$ and $M_{N2}$ are connected to the output end of the leakage-based inverter as the Schmitt trigger's input end $V_{IN2}$, the source end of $M_{P1}$ is connected to VDD, the source end of $M_{N1}$ is connected to GND, the drain end of $M_{P1}$ is connected to the source end of $M_{P2}$, the drain end of $M_{N1}$ is connected to the source end of $M_{N2}$, the drain end of $M_{N2}$ is connected to the drain end of $M_{P2}$, the drain ends of $M_{P4}$ and $M_{N4}$ are connected and as the Schmitt trigger's output, the source end of $M_{P4}$ is connected to the VDD, the source end of $M_{N4}$ is connected to GND; the drain end of $M_{P3}$ is connected to GND, the drain end of $M_{N3}$ is connected to the VDD, the source end of $M_{P3}$ is connected to $M_{P1}$'s drain end and $M_{P2}$'s source end, the source end of $M_{N3}$ is connected to $M_{N1}$'s drain end and $M_{N2}$'s source end; the drain ends of $M_{P2}$ and $M_{N2}$, the gate ends of $M_{P3}$ and $M_{N3}$, the gate ends of $M_{P4}$ and $M_{N4}$ are connected. There are many other kind of Schmitt triggers also can be used in the temperature sensor.

The temperature sensor circuit includes a NAND gate and several delay units, which formed a type of ring oscillator. It is known that, there are an exponential relationship between leakage current ($I_{off}$) of MOS transistor and temperature (T): $I_{off} \approx \alpha_1 \cdot e(\alpha_2/T)$, wherein $\alpha_1$ and $\alpha_2$ are constants for a particular chip; in ring oscillator, the relationship between leakage current and output frequency also is exponential, and the leakage current of MOS transistor is also in an exponential relationship to temperature; it can deduce that the output frequency is exponential relationship to temperature, therefore, the temperature can be obtained by the output frequency of the ring oscillator. Therefore, the temperature variation can be monitored by the temperature sensor with digital output.

The temperature sensor circuit can be worked in the PMOS leakage mode and the NMOS leakage mode by controlling the input level $V_P$ and $V_N$ respectively: when $V_P$ and $V_N$ are high level, the temperature sensor works in the PMOS leakage mode; when $V_P$ and $V_N$ are low level, the temperature sensor circuit works in the NMOS leakage mode.

The PMOS leakage mode is the first stage PMOS of the leakage-based inverter in temperature sensor circuit works in the state of leakage; the NMOS leakage mode is the first stage NMOS of the leakage-based inverter in temperature sensor circuit works in the state of leakage.

In the leakage-based inverter, the second stage to the N-th stage PMOS and NMOS are composed of an equivalent inverter, the first stage PMOS' leakage in the PMOS leakage mode is the main leakage in the temperature sensor circuit, the first stage NMOS' leakage in the NMOS leakage mode is the main leakage in the temperature sensor circuit, therefore, the temperature can be obtain accurately in the two modes.

Compared with the single threshold of the existing temperature sensor, there are two threshold voltages in the Schmitt trigger: low level threshold voltage VTL and high level threshold voltage TH; therefore, in some embodiments, the values of the two threshold voltages can be designed for PMOS leakage mode and NMOS leakage mode respectively to optimize the sensitivity of power supply in the two modes. When external interference exists, the misjudgment never occur as long as the interference voltage is not higher than TH or lower than VTL, so as to enhance the anti-interference of the temperature sensor.

In some embodiments, the values of threshold voltages of PMOS transistors and NMOS transistors in the Schmitt trigger can be adjusted for the two modes respectively to optimize the sensitivity of power supply.

In some embodiments, the threshold voltage of PMOS transistors and NMOS transistors in the leakage-based inverter are adjusted for the two modes to optimize the sensitivity of power supply.

In some embodiments, the threshold voltage of PMOS transistors and NMOS transistors of in the leakage-based inverter and the Schmitt trigger are adjusted by adjusting gate size and/or manufacturing process.

In some embodiments, the temperature sensor can control the working state of the first stage PMOS transistor ($M_{P-1}$ in FIG. 9) and the first stage NMOS transistor ($M_{N-1}$ in FIG. 9) through $V_P$ and $V_N$, so as to control the temperature sensor circuit works in PMOS leakage mode or the NMOS leakage mode: when $V_P$ and $V_N$ are at low level, the temperature sensor works in NMOS leakage mode; when $V_P$ and $V_N$ are at high level, the temperature sensor works in PMOS leakage mode.

In some embodiments, in consideration of chip area, parasitic capacitance and leakage effects, the first stage PMOS and NOMS are used as the main leakage devices in the two leakage mode of temperature sensor circuit respectively; the second stage to the N-th stage PMOS and NMOS in the leakage-based inverter composed of an equivalent inverter. In some embodiments, more stage of PMOS or NOMS can be used as the main leakage devices in temperature sensor circuit.

In some embodiments, the $V_P$ signal end is connected to the $V_N$ signal end in each delay unit, and all the $V_P$ and $V_N$ signal ends are connected to the same signal line.

Various embodiments of the present disclosure also provide a method for temperature measurement by applying the temperature sensor.

In some embodiments, the temperature sensor works in the PMOS leakage mode: the $V_P$ and the $V_N$ are at high level, the first stage PMOS transistors are in off-state and work in the state of leakage, and the leakage is the main leakage in the temperature sensor circuit; if the $V_{IN1}$ is high level VDD, the low level GND is outputted through the equivalent inverter, and low level GND is outputted through the Schmitt trigger; if the $V_{IN1}$ is low level GND, the $V_{IN2}$ is gradually charged through the equivalent inverter due to the leakage effect of the first stage PMOS, and when the $V_{IN2}$ reaches the high level threshold TH of the Schmitt trigger, the Schmitt trigger's $V_{OUT}$ outputs high level VDD.

In some embodiments, the temperature sensor works in the NMOS leakage mode: the $V_P$ and the $V_N$ are at low level, the first stage NMOS transistors are in off-state and work in the state of leakage, and the leakage is the main leakage in the temperature sensor circuit; if the $V_{IN1}$ is high level VDD, the $V_{IN2}$ is gradually discharged through the equivalent inverter due to the leakage effect of the first stage NMOS, and when the $V_{IN2}$ reaches the low level threshold VTL of the Schmitt trigger, the Schmitt trigger's $V_{OUT}$ outputs low level GND; if the $V_{IN1}$ is low level GND, the high level VDD is outputted through the equivalent inverter, and high level VDD is outputted through the Schmitt trigger.

As the temperature sensor circuit is a type of ring oscillator structure, its output frequency can be obtained in the PMOS leakage mode and the NMOS leakage mode respectively, and the temperature value can be calculated through the exponential relationship between the output frequency and the temperature.

A test system with the temperature sensor described above can also be provided. The test system includes at least one temperature sensor described above, and the temperature sensor can measure the temperature of the test system.

In some embodiments, in addition to the temperature sensor, the test system can include at least one device or chip which need to do heat management.

For the temperature sensor, the delay unit has strong anti-interference ability, and small area due the simple design of the delay unit; the temperature sensor supports full-digital design, greatly simplifies the design complexity, and the design of circuit is flexible, users can choose the number of delay units to reconstruct the temperature sensor circuit according to requirements.

For the output frequency measurement of the temperature sensor, the testing circuit can be composed by referring clock and counter, for multiple temperature sensors of multi-point temperature monitoring, one frequency testing circuit can be shared, therefore the area of temperature sensor can be further reduced.

The various device components, units, blocks, or portions may have modular configurations, or are composed of discrete components, but nonetheless can be referred to as "modules" in general. In other words, the "components," "modules," "blocks," "portions," or "units" referred to herein may or may not be in modular forms.

Other implementation solutions of the present disclosure will be apparent to those skilled in the art from consideration of the specification and practice of the present disclosure. This disclosure is intended to cover any variations, uses, or adaptations of the present disclosure following the general principles thereof and including such departures from the present disclosure as come within known or customary practice in the art. It is intended that the specification and examples be considered as exemplary only, with a true scope and spirit of the present disclosure being indicated by the following claims.

In the description of the present disclosure, the terms "one embodiment," "some embodiments," "example," "specific example," or "some examples," and the like can indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described can be combined in a suitable manner in any one or more embodiments or examples. In addition, various embodiments or examples described in the specification, as well as features of various embodiments or examples, can be combined and reorganized.

In some embodiments, the control and/or interface software or app can be provided in a form of a non-transitory computer-readable storage medium having instructions stored thereon. For example, the non-transitory computer-readable storage medium can be a ROM, a CD-ROM, a magnetic tape, a floppy disk, optical data storage equipment, a flash drive such as a USB drive or an SD card, and the like.

Implementations of the subject matter and the operations described in this disclosure can be implemented in digital electronic circuitry, or in computer software, firmware, or hardware, including the structures disclosed herein and their structural equivalents, or in combinations of one or more of them. Implementations of the subject matter described in this disclosure can be implemented as one or more computer programs, i.e., one or more portions of computer program instructions, encoded on one or more computer storage medium for execution by, or to control the operation of, data processing apparatus.

Alternatively, or in addition, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them.

Moreover, while a computer storage medium is not a propagated signal, a computer storage medium can be a source or destination of computer program instructions encoded in an artificially-generated propagated signal. The computer storage medium can also be, or be included in, one or more separate components or media (e.g., multiple CDs, disks, drives, or other storage devices). Accordingly, the computer storage medium can be tangible.

The operations described in this disclosure can be implemented as operations performed by a data processing apparatus on data stored on one or more computer-readable storage devices or received from other sources.

The devices in this disclosure can include special purpose logic circuitry, e.g., an FPGA (field-programmable gate array), or an ASIC (application-specific integrated circuit). The device can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The devices and execution environment can realize various different computing model infrastructures, such as web services, distributed computing, and grid computing infrastructures.

A computer program (also known as a program, software, software application, app, script, or code) can be written in any form of programming language, including compiled or interpreted languages, declarative or procedural languages, and it can be deployed in any form, including as a standalone program or as a portion, component, subroutine, object, or other portion suitable for use in a computing environment. A computer program can, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more portions, sub-programs, or portions of code). A computer program can be deployed to be executed on one computer or on multiple computers that are located at one site or distributed across multiple sites and interconnected by a communication network.

The processes and logic flows described in this disclosure can be performed by one or more programmable processors executing one or more computer programs to perform actions by operating on input data and generating output. The processes and logic flows can also be performed by, and apparatus can also be implemented as, special purpose logic circuitry, e.g., an FPGA, or an ASIC.

Processors or processing circuits suitable for the execution of a computer program include, by way of example, both general and special purpose microprocessors, and any one or more processors of any kind of digital computer. Generally, a processor will receive instructions and data from a read-only memory, or a random-access memory, or both. Elements of a computer can include a processor configured to perform actions in accordance with instructions and one or more memory devices for storing instructions and data.

Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few.

Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, implementations of the subject matter described in this specification can be implemented with a computer and/or a display device, e.g., a VR/AR device, a head-mount display (HMD) device, a head-up display (HUD) device, smart eyewear (e.g., glasses), a CRT (cathode-ray tube), LCD (liquid-crystal display), OLED (organic light emitting diode), or any other monitor for displaying information to the user and a keyboard, a pointing device, e.g., a mouse, trackball, etc., or a touch screen, touch pad, etc., by which the user can provide input to the computer.

Implementations of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components.

The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the implementations described above should not be understood as requiring such separation in all implementations, and it should be understood that the described program components and systems can generally be integrated together in a single software product or packaged into multiple software products.

As such, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing can be utilized.

It is intended that the specification and embodiments be considered as examples only. Some other embodiments of the present disclosure can be available to those skilled in the art upon consideration of the specification and practice of the various embodiments disclosed herein. The present application is intended to cover any variations, uses, or adaptations of the present disclosure following general principles of the present disclosure and include the common general knowledge or conventional technical means in the art without departing from the present disclosure. The specification and examples can be shown as illustrative only, and the true scope and spirit of the disclosure are indicated by the following claims.

The invention claimed is:

1. A temperature sensor comprising:
a NAND gate; and
K delay units;
wherein:
the NAND gate comprises a first and a second input terminals and an output terminal;
the first input terminal is coupled to an external starting control signal;
each of the K delay units comprises a leakage-based inverter and a Schmitt trigger, and an output end of the leakage-based inverter is connected to an input end of the Schmitt trigger;
the K delay units are connected in series;
an input end of a first delay unit among the K delay units is connected to the output terminal of the NAND gate;
an output end of a last delay unit among the K delay units is connected to the second input terminal of the NAND gate, thereby forming a ring oscillator structure; and
K is an even number greater than 0.

2. The temperature sensor of claim 1, wherein
the leakage-based inverter includes N-stages of PMOS transistors and N-stages of NMOS transistors, wherein N is an integer greater than 1; a drain end of a previous stage PMOS transistor is connected to a source end of a next stage PMOS transistor, a source end of a first stage PMOS transistor is connected to VDD, a gate end of the first stage PMOS transistor is connected to a $V_P$ signal end, and gate ends of second stage through N-th stage PMOS transistors are connected to a $V_{IN1}$ signal end; a drain end of a previous stage NMOS transistor is connected to a source end of a next stage NMOS transistor, a source end of a first stage NMOS transistor is connected to GND, a gate end of the first stage NMOS transistor is connected to a $V_N$ signal end, and gate ends of second stage through N-th stage NMOS transistors are connected to a $V_{IN1}$ signal end; a drain end of the N-th PMOS transistor and a drain end of the N-th NMOS transistor are connected as the output end of the leakage-based inverter.

3. The temperature sensor of claim 2, wherein all the $V_P$ and $V_N$ signal ends of the leakage-based inverter are connected to a same signal line.

4. The temperature sensor of claim 2, wherein a threshold voltage of the N-stages of NMOS transistors and/or the N-stages of PMOS transistors of the leakage-based inverters in the K delay units are adjustable to optimize a sensitivity of power supply in a leakage mode of the N-stages of PMOS and the N-stages of NMOS respectively.

5. The temperature sensor of claim 2, wherein a threshold voltage of the N-stages of NMOS transistors and/or the N-stages of PMOS transistors of the Schmitt triggers in the K delay units are adjustable to optimize a sensitivity of power supply in a leakage mode of the N-stages of PMOS and the N-stages of NMOS respectively.

6. The temperature sensor of claim 5, wherein the threshold voltage of the N-stages of NMOS transistors and the N-stages of PMOS transistors of the Schmitt triggers in the K delay are adjustable by adjusting a gate size and/or a manufacturing process.

7. The temperature sensor of claim 1, wherein:
the Schmitt trigger comprises four PMOS transistors and four NMOS transistors, the four PMOS transistors are: $M_{P1}$, $M_{P2}$, $M_{P3}$ and $M_{P4}$; the four NMOS transistors are: $M_{N1}$, $M_{N2}$, $M_{N3}$ and $M_{N4}$;
gate ends of $M_{P1}$, $M_{P2}$, $M_{N1}$ and $M_{N2}$ are connected to the output end of the leakage-based inverter as the input end $VIN_2$ of the Schmitt trigger, a source end of $M_{P1}$ is connected to VDD, a source end of $M_{N1}$ is connected to GND, a drain end of $M_{P1}$ is connected to a source end of $M_{P2}$, a drain end of $M_{N1}$ is connected to a source end of $M_{N2}$, a drain end of $M_{N2}$ is connected to a drain end of $M_{P2}$;
drain ends of $M_{P4}$ and $M_{N4}$ are connected as an output of the Schmitt trigger, a source end of $M_{P4}$ is connected to the VDD, a source end of $M_{N4}$ is connected to the GND; a drain end of $M_{P3}$ is connected to the GND, a drain end of $M_{N3}$ is connected to the VDD, a source end of $M_{P3}$ is connected to the drain end of $M_{P1}$ and the source end of $M_{P2}$, a source end of $M_{N3}$ is connected to the drain end of $M_{N1}$ and the source end of $M_{N2}$; and the drain ends of $M_{P2}$ and $M_{N2}$, the gate ends of $M_{P3}$ and $M_{N3}$, the gate ends of $M_{P4}$ and $M_{N4}$ are connected.

8. A method for temperature measurement by applying the temperature sensor of claim 1, comprising:
measuring an output frequency of the temperature sensor; and obtaining a temperature value through an exponential relationship between the output frequency and the temperature.

9. The method for temperature measurement of claim 8, wherein
the output frequency is measured in a PMOS leakage mode and an NMOS leakage respectively; and
when $V_P$ and $V_N$ are at a high level, the temperature sensor functions in the PMOS leakage mode, and when $V_P$ and $V_N$ are at a low level, the temperature sensor functions in the NMOS leakage mode.

10. A test system comprising the temperature sensor of claim 1, wherein the temperature sensor is configured to monitor a temperature of the test system comprising the temperature sensor.

11. The test system of claim 10, further comprising at least one device or chip that is to be heat managed.

12. An apparatus comprising the temperature sensor of claim 1, wherein the temperature sensor is configured to function under a digital power supply of less than 1V, and realize conversion of temperature-leakage-frequency based on the ring oscillator structure in a temperature range of −40~125° C., with an accuracy better than 2° C.

13. The apparatus of claim 12, wherein the temperature sensor is reconfigurable to realize a controllable circuit area.

14. The apparatus of claim 13, wherein the temperature sensor has a power consumption in a level of µW, thereby reducing self-heating and aging.

15. The apparatus of claim 14, the Schmitt trigger of each of the K delay units is configured to reduce misjudgment caused by an external interference voltage exceeding a range between a high-level threshold and a low-level threshold.

16. The apparatus of claim 15, wherein the temperature sensor is configured to function in an NMOS leakage mode and a PMOS leakage mode.

17. The apparatus of claim 16, wherein the temperature sensor is configured to offset a leakage variation and a threshold variation caused by VDD variation by adjusting the high-level threshold and the low-level threshold, thereby improving sensitivity of temperature measurement.

18. The apparatus of claim 17, wherein:
the leakage-based inverter includes N-stages of PMOS transistors and N-stages of NMOS transistors, wherein N is an integer greater than 1;
in the PMOS leakage mode, a $V_P$ signal end and a $V_N$ signal end are controlled at a high level of the temperature sensor, a first stage NMOS transistor of the N-stages of NMOS transistors is in an on-state, a first stage PMOS transistor of the N-stages of PMOS transistors is in an off-state and functions in a state of leakage;
upon that a $V_{IN1}$ signal end is at a high level VDD, a low level GND is outputted through an equivalent inverter, and the low level GND is outputted through the Schmitt trigger;
upon that the $V_{IN1}$ signal end is at the low level GND, a $V_{IN2}$ signal end is gradually charged through the equivalent inverter due to a leakage effect of the first stage PMOS;
upon that the $V_{IN2}$ signal end reaches a high-level threshold VTH of the Schmitt trigger, an output of the Schmitt trigger $V_{out}$ outputs the high level VDD.

19. The apparatus of claim 18, wherein:
in the NMOS leakage mode, an $V_P$ signal end and an $V_N$ are controlled at a low level of the temperature sensor, the first stage PMOS transistor is in an on-state, the first stage NMOS transistor is in an off-state and functions in a state of leakage;
upon that the $V_{IN1}$ signal end is at the high level VDD, the $V_{IN2}$ signal end is gradually discharged through the equivalent inverter due to the leakage effect of the first stage NMOS transistor;
upon that the $V_{IN2}$ signal reaches a low-level threshold VTL of the Schmitt trigger, the Schmitt trigger's $V_{OUT}$ outputs the low level GND; and
upon that the $V_{IN1}$ signal end is at the low level GND, the high level VDD is outputted through the equivalent inverter, and the high level VDD is outputted through the Schmitt trigger.

20. The apparatus of claim 19, wherein:
wherein an output frequency of the ring oscillator structure is configured to be measured and used to characterize temperature based on that delay of the each delay unit among the K delay units is primarily determined by leakage of the N stages of MOS transistors, which is correlated with the temperature, and the output frequency of the ring oscillator structure is correlated with the temperature.

* * * * *